United States Patent [19]

Faller et al.

[11] Patent Number: 5,705,853
[45] Date of Patent: Jan. 6, 1998

[54] POWER SEMICONDUCTOR MODULE

[75] Inventors: Kurt Faller, Brugg, Switzerland; Toni Frey, La Jolla, Calif.; Helmut Keser, Ennetbaden, Switzerland; Ferdinand Steinruck, Mosen, Switzerland; Raymond Zehringer, Künten, Switzerland

[73] Assignee: Asea Brown Boveri AG, Baden, Switzerland

[21] Appl. No.: 699,430

[22] Filed: Aug. 19, 1996

[30] Foreign Application Priority Data

Aug. 17, 1995 [DE] Germany .............. 195 30 264.8

[51] Int. Cl.⁶ .................. H01L 29/74; H01L 23/16; H01L 25/07; H01L 23/02
[52] U.S. Cl. ............. 257/719; 257/718; 257/785; 257/727; 257/726; 257/177; 257/181; 257/690
[58] Field of Search .................. 257/690, 704, 257/710, 718, 719, 726, 727, 785, 779, 772, 177, 181, 409, 146, 150

[56] References Cited

U.S. PATENT DOCUMENTS

| | | | |
|---|---|---|---|
| 3,064,341 | 11/1962 | Masterson | 29/25.3 |
| 3,972,012 | 7/1976 | Liu | 257/719 |
| 4,574,299 | 3/1986 | Glascock, II et al. | 257/717 |
| 4,646,131 | 2/1987 | Amagasa et al. | 257/785 |
| 5,016,088 | 5/1991 | Ermilou et al. | 257/726 |
| 5,221,851 | 6/1993 | Gobrecht et al. | 257/726 |

FOREIGN PATENT DOCUMENTS

| | | | |
|---|---|---|---|
| 804796 | 1/1969 | Canada | 257/727 |
| 1464874 | 6/1969 | Canada | 257/727 |
| 00 04 289 A2 | 2/1979 | European Pat. Off. | |
| 12 50 928 | 7/1962 | Germany. | |
| 12 82 195 | 3/1963 | Germany. | |
| 12 95 696 | 3/1963 | Germany. | |
| 14 89 736 | 8/1974 | Germany. | |
| 28 32 040 | 7/1978 | Germany. | |
| 29 36 816 A1 | 9/1979 | Germany. | |
| 30 09 295 | 3/1980 | Germany. | |
| 33 22 593 A1 | 6/1983 | Germany. | |
| 35 38 815 C2 | 10/1985 | Germany. | |
| 43 14 913 C1 | 5/1993 | Germany. | |
| 60-89946 | 5/1985 | Japan | 257/718 |
| 2-1959 | 1/1990 | Japan | 257/719 |
| 6-232303 | 8/1994 | Japan | 257/690 |

OTHER PUBLICATIONS

Roberts, Bruce, et al., "Interconnect Metallization for Future Device Generations"; Solid State Technology, Feb. 1995; pp. 69, 70, 72, 74, 76 and 78.

*Primary Examiner*—Tom Thomas
*Assistant Examiner*—Alexander Oscar Williams
*Attorney, Agent, or Firm*—Oblon, Spivak, McClelland, Maier & Neustadt, P.C.

[57] ABSTRACT

A power semiconductor module is specified in which at least one semiconductor chip, which is fitted on a baseplate, is made contact with by a respective contact plunger. The position of the contact plungers can be set individually in a manner corresponding to a distance between the semiconductor chips and a main connection which accommodates the contact plungers. The contact plungers are either subjected to pressure by means of a spring or fixed by means of a solder layer.

6 Claims, 2 Drawing Sheets

POWER SEMICONDUCTOR MODULE

TECHNICAL FIELD

The invention relates to the field of power electronics. It is based on a power semiconductor module according to the preamble of the first claim.

PRIOR ART

Such a power semiconductor module is already described in the U.S. patent with the U.S. Pat. No. 5,221,851. This involves a so-called pressure contact semiconductor module in which a plurality of semiconductor chips are applied to a baseplate by their first main electrode. The second main electrodes of the chips are made contact with by a plurality of contact plungers. The baseplate is connected to a first main connection and the contact plungers are connected to a second main connection. The main connections may be designed in the form of discs and held together by means of flanges. The pressure contact is therefore designed in the form of a copper plunger which presses onto the individual chips.

What is problematic in this arrangement, however, is the requirement of plane parallelism of the chip surfaces and of the copper plungers. The plane parallelism required for a pressure contact is, for example, only a few micrometers in the case of a circular disc having a diameter of 7 cm. When the arrangement has a plurality of chips, it is very difficult to comply with this requirement, since with conventional soldering technology the individual chips can in practice rarely be soldered at a common level, let alone in a plane parallel manner.

EXPLANATION OF THE INVENTION

The object of the present invention, therefore, is to specify a power semiconductor module in which less stringent requirements are made of plane parallelism.

This object is achieved, in the case of a power semiconductor module of the type mentioned in the introduction, by means of the features of the first claim.

The core of the invention, then, is that the position of the or of each contact plunger can be set individually corresponding to the distance between the or each semiconductor chip and the second main connection. Since the position of the contact plungers can be set individually for each semiconductor chip, the plane parallelism no longer has such a major significance.

The contact plungers are mounted such that they can move. In order to set the position, provision is made of means designed for this purpose. The said means may comprise, for example, a solder layer or a spring with relevant sliding contacts. The solder layer surrounds the contact plunger in holes provided for this purpose and is used both for mechanically fixing the contact plungers and for making electrical contact. In the case of the variant with the springs, the latter are arranged in the holes which are provided for accommodating the contact plungers. In order to improve the electrical contact, it is possible additionally to provide a sliding contact, for example in the form of a sliding spring having a multiplicity of individual lamellae made of electrically readily conducting material, along the side walls of the holes.

Semiconductor modules in which the contact plungers are fixed by means of soldering are best produced by first of all soldering the semiconductor chips onto the baseplate. The baseplate with the semiconductor chips is subsequently inserted into the second main connection which is equipped with at least one hole and with at least one contact plunger and a solder layer placed between them. The position of the baseplate with respect to the second main connection is now fixed, and the semiconductor module is soldered in a soldering furnace with the second main connection pointing upwards. In this process, the solder layer between the contact plunger and the second main connection melts and fixes the individual position of the contact plungers. This has been automatically set prior to the soldering operation on account of the force of gravity.

The advantage of the invention therefore resides in the fact that such stringent requirements of plane parallelism are no longer required. This permits, in particular, cost-effective production of the modules. In addition, the contact-making of the chips by means of contact pins, whether the latter are soldered on or subjected to pressure by means of springs, ensures a permanent and individual pressure on each individual chip. A permanent, low contact resistance between the housing contacts and the chip is achieved as a result particularly if the module or parts thereof fuse in the event of a fault. The bonding wires blow in the prior art. This can result in the complete destruction of the component. Consequently, the type of contact-making according to the invention additionally affords the advantage that in the event of failure of one of the internally parallel-connected chips, the entire nominal current but also the short-circuit current can be conducted with low resistance via the defective chip.

Further exemplary embodiments emerge from the corresponding dependent claims.

BRIEF DESCRIPTION OF THE DRAWINGS

The invention is explained in more detail below using exemplary embodiments in connection with the drawings, in which.

The reference symbols used in the drawings and their meanings are summarized in the list of designations. In principle, identical parts are provided with identical reference symbols in the figures.

WAYS OF EMBODYING THE INVENTION

Figure 1:
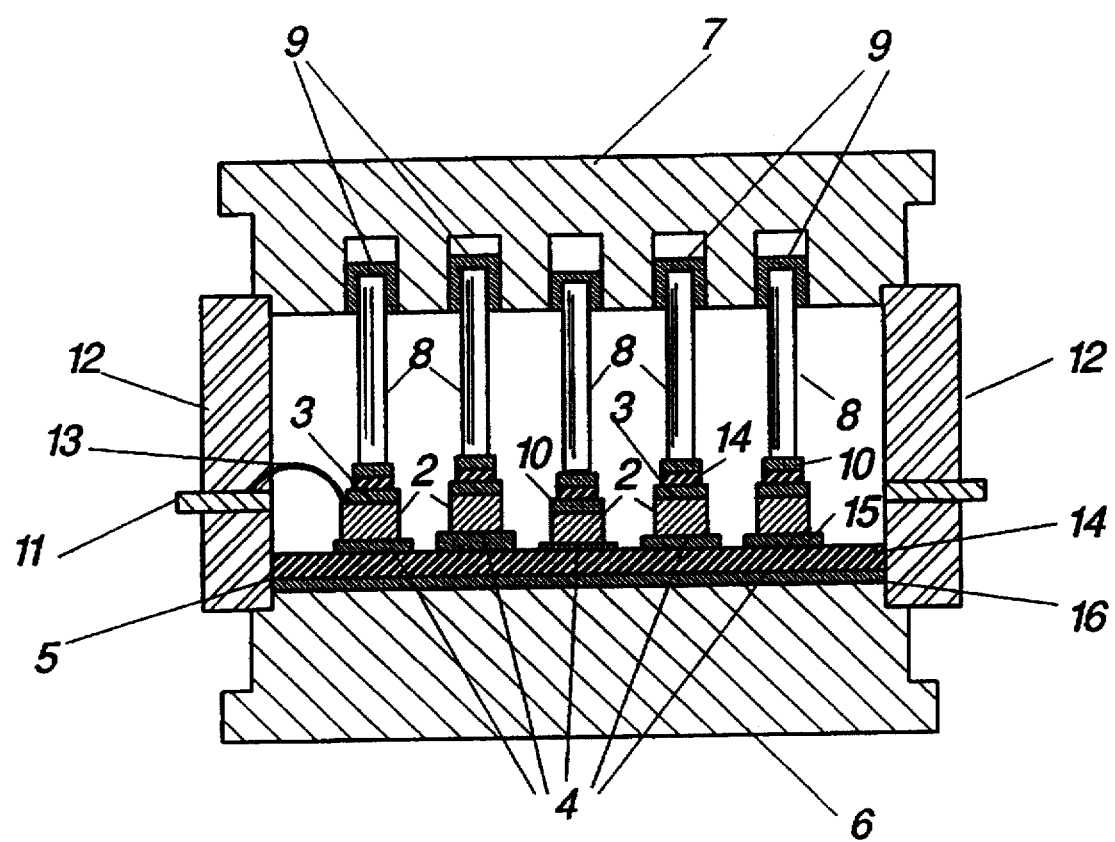
FIG. 1 shows a section through a first embodiment of a power semiconductor module according to the invention.

FIG. 1 shows a first example of how the invention can be realized. 1 designates a power semiconductor module which has a first and a second main connection 6, 7. The main connections 6, 7 may be composed of a solid copper block. A baseplate 5 is applied to the first main connection 6. The said baseplate may be, for example, a molybdenum plate 14, a ceramic plate or a plate made of other suitable materials which is fixed on the first main connection 6 by a solder layer 16. The cross-section of the baseplate is not important for the invention. It may be round or cornered. A plurality of semiconductor chips 2, more generally at least one semiconductor chip 2, are soldered onto the baseplate 5. The semiconductor chips are preferably IGBT chips or diode chips or a combination of these types of chips. In principle, however, the chips 2 have at least two main electrodes 3 and 4 which are made contact with by the corresponding main connections 6 and 7. In the case of IGBT chips, a third electrode, a control electrode, is additionally provided and is connected to a control connection 1 via a connecting wire 13. The connecting wire 13 is bonded, for example, to the control electrode of the chip 2. One main electrode 4 is formed by the underside of the chip 2 and is directly connected to the baseplate 5.

The other main electrode 3 of the semiconductor chips 2 is made contact with by a number of contact plungers 8, which number corresponds to the number of chips. As has already been explained in the introduction, there is a problem with power semiconductor modules in that it is difficult to solder the chips 2 on at the same level. The high degree of plane parallelism is necessary, however, for a problem-free pressure contact. In order to make the problem clear, the solder layers 15 of different thicknesses are shown exaggerated in FIG. 1. The situation where the chips have different thicknesses, for example in the case of a combination of different types of chips, also has the effect of imparting different height to the stacks comprising solder layers, molybdenum discs placed between them if need be and semiconductor chips. The invention now succeeds in constructing a power semiconductor module in which this difference no longer constitutes a disadvantage.

This is achieved by virtue of the fact that prior to the actual assembly, the contact plungers 8 are arranged such that they can move in their holes in the second main connection 7. In order to be able to fix the contact plungers after assembly, a solder layer 9 is provided between the hole and the contact plunger 8 in accordance with the first exemplary embodiment. During assembly, this solder layer is made to melt in a soldering furnace, thereby fixing the contact plungers. Automatic adaptation of the contact plunger length to the individual distance between the second main connection 7 and the semiconductor chips 2 is achieved most simply and preferably by soldering the semiconductor module with the second main connection 7 pointing upwards. The contact plungers 8 fall downwards due to the force of gravity and make contact with the chips. Provided between the chips 2 and the contact plungers 8 is a further solder layer 10, if need be with a molybdenum disc placed in between. This solder layer 10 is soldered in the soldering furnace in the same work step as the solder layer 9. In order to fix the position of the first main connection with respect to the second main connection, the arrangement is surrounded by a fixing apparatus which, after adjustment has been effected, ensures a precisely aligned connection of the contact plungers 8 on the chips 2 during the soldering operation.

A power semiconductor module constructed in the manner described above can be fitted, for example, in a pressure contact housing which is known from GTO technology. In this case, it is advantageous if a supporting ring 12 is provided between the first and the second main connection 6 and 7. The said supporting ring relieves the pressure on the soldering points of the chip and on the contact plungers. A control connection 11 provided as appropriate is then best routed through the supporting ring 12.

Figure 2:
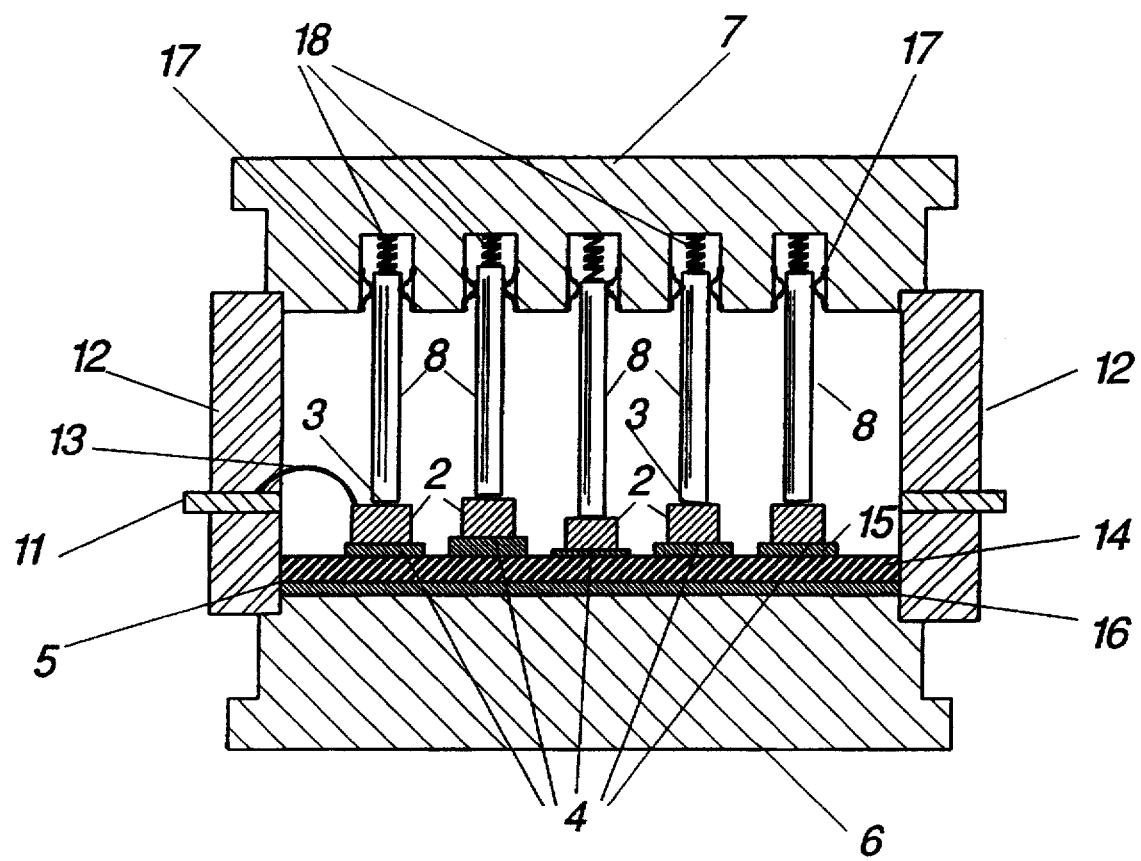
FIG. 2 shows a section through a second embodiment of a power semiconductor module according to the invention.

FIG. 2 shows a further exemplary embodiment of a power semiconductor module according to the invention. The structure essentially corresponds to that according to FIG. 1, and corresponding parts are provided with the same reference symbols. However, a combination of springs 18 and a sliding contact 17 are in this case provided instead of solder layers 9 for the purpose of fixing and setting the length of the contact plungers 8. The springs are arranged in holes in the second main connection 7 and apply pressure to the contact plungers 8. The length of the contact plungers is set in this way. Sliding contact springs 17 can additionally be provided in order to improve the electrical contact between the contact plungers 8 and the second main connection 7. The said sliding contact springs are arranged along the hole walls between the contact plungers and the main connection. The spring sliding contacts may have a multiplicity of individual lamellae.

The contact plungers 8 subjected to spring pressure now press onto the chips 2. In contrast with the first exemplary embodiment, in which a combination of solder layers 10 and Mo laminae 14 is required for making contact with the chips 2, direct contact-making between the chips 2 and the contact plungers 8 is sufficient in this case.

It is also possible to construct different types of modules using the power semiconductor module according to the invention. If a combination of IGBT chips and diode chips is used, as in the U.S. patent specification cited in the introduction, for example, then a switch module is obtained in which the reverse-connected parallel diode is integrated. However, it is also conceivable to integrate complete half- or quarter-bridge modules of converters in such a power semiconductor module or simply to construct just one high-power diode. Moreover, the invention is also not restricted to IGBTs, but rather is advantageously used for all types of power semiconductor chips. Although the above description is based on a circular cross-section of the module, the invention is not restricted to such cross-sections.

Overall, the invention yields a power semiconductor module in which the requirements of plane parallelism are less stringent than in the prior art and which can consequently be produced and constructed more easily.

| List of designations | |
| --- | --- |
| 1 | Power semiconductor module |
| 2 | Semiconductor chips |
| 3, 4 | Electrodes |
| 5 | Baseplate |
| 6, 7 | Main connections |
| 8 | Contact plungers |
| 9, 10 | Solder layer |
| 11 | Control connection |
| 12 | Supporting ring |
| 13 | Connecting wire |
| 14 | Molybdenum plate |
| 15, 16 | Solder layer |
| 17 | Sliding contact |
| 18 | Spring |

We claim:

1. A power semiconductor module, comprising:
plural semiconductor chips each having at least a first and a second main electrode;
a baseplate attached to each first main electrode of said plural semiconductor chips;
a first main connection attached to said baseplate and electrically interacting with each first main electrode;
a second main connection having plural contact plungers slidably attached to a second main connection, each contact plunger positioned according to a distance between said second main connection and a respective one of said plural semiconductor chips to electrically connect the second main electrode to each of said plural semiconductor chips; and
a means for fixing the position of each of said plural contact plungers.

2. The power semiconductor module according to claim 1, wherein said second main connection further comprises plural holes for individually accommodating each of said plural contact plungers slidably attached to said second main connection; and wherein the means for fixing the position of each of said plural contact plungers is two solder layers, comprising:
- a first solder layer between each contact plunger and each respective semiconductor chip and;
- a second solder layer between each contact plunger and a respective one of said plural holes accommodating each contact plunger.

3. The power semiconductor module according to claim 1, wherein said second main connection further comprises plural holes for individually accommodating each of said plural contact plungers slidably attached to said second main connection; and wherein the means for fixing the position of each of said plural contact plungers comprises:
- plural springs each arranged in a respective of said plural holes accommodating each contact plunger.

4. The power semiconductor module according to claim 3, further comprising electrically conductive plural sliding springs positioned between said plural contact plungers and side walls of said plural holes accommodating each of said plural contact plungers.

5. A method for production of a semiconductor module, comprising the steps of:

soldering a first main electrode of plural semiconductor chips onto a base plate;

placing plural plungers each corresponding to a respective one of said plural semiconductor chips individually into plural holes of a main connection;

arranging said main connection above said plural semiconductor chips so that each of said plural plungers in said plural holes slide toward and contact a second main electrode of each respective one of said plural semiconductor chips;

placing a first solder layer between each of said plural plungers and a second main electrode of each respective semiconductor chip;

placing a second solder layer between each of said plural plungers and a wall of each of said plural holes where said plural plungers are individually placed;

melting said first and second solder layers; and cooling said first and second solder layers, thereby fixing said plural plungers in said plural holes and in contact with said second main electrode in the position resulting from said arranging step.

6. The method according to claim 5, wherein said melting step comprises the substep of:

placing said plural semiconductor chips, said main electrode, said plural plungers and said first and second solder layers, as arranged by said arranging step, into a solder furnace.

* * * * *